United States Patent

[11] 4,054,893
[45] Oct. 18, 1977

Hutson

[54] SEMICONDUCTOR SWITCHING DEVICES UTILIZING NONOHMIC CURRENT PATHS ACROSS P-N JUNCTIONS

[76] Inventor: Jearld L. Hutson, P.O. Box 34235, Dallas, Tex. 75234

[21] Appl. No.: 644,562

[22] Filed: Dec. 29, 1975

[51] Int. Cl.² .................... H01L 29/48; H01L 29/56; H01L 29/64; H01L 29/74
[52] U.S. Cl. ........................................ 357/15; 357/38; 357/39; 357/55; 357/86
[58] Field of Search .................... 357/15, 38, 39, 86, 357/55

[56] References Cited

U.S. PATENT DOCUMENTS

| 3,401,320 | 9/1968 | Weinstein | 357/38 |
|---|---|---|---|
| 3,475,666 | 10/1969 | Hutson | 307/305 |
| 3,541,357 | 11/1970 | Kram | 357/15 |
| 3,623,029 | 11/1971 | Davidson | 357/15 |
| 3,634,931 | 1/1972 | Kano et al. | 357/15 |
| 3,725,753 | 4/1973 | Garrett | 307/305 |
| 3,913,213 | 10/1975 | Millis et al. | 357/15 |

FOREIGN PATENT DOCUMENTS

| 2,348,892 | 4/1975 | Germany | 357/38 |

OTHER PUBLICATIONS

IBM Technical Disclosure Bulletin, by Anantha et al., vol. 14, No. 1, June 1971 pp. 96 and 97.
IBM Technical Disclosure Bulletin, by Magdo et al., vol. 14, No. 3, Aug. 1971.
Hot Carrier Diodes Switch in Picoseconds by Soshea et al., Electronics, July 1963 pp. 53–55.
The Evolution of a High-Power Fast Switching Thyristor by Garrett, Electrical Engineer, May 1971, pp. 33–35.
IEEE Conference Oct. 1973, Characteristics of a 200 Amp Gate Turn-off Thyristor by Wolley et al., pp. 251–254.

*Primary Examiner*—Andrew J. James
*Attorney, Agent, or Firm*—Richards, Harris & Medlock

[57] ABSTRACT

The specification discloses semiconductor devices including a semiconductor body having layers of opposite conductivity types to form at least one P-N junction which intersects a face of the semiconductor body. A selected material spans the P-N junction in order to provide a nonohmic current path across the P-N junction, the conductance characteristics of the material being always positive. Electrodes contact the body to form an electrical switching device having improved operating characteristics over a wide temperature range. In the preferred embodiment, the material has a reverse breakdown higher than the forward conduction characteristics of the P-N junction and comprises a Schottky diode.

19 Claims, 12 Drawing Figures

SEMICONDUCTOR SWITCHING DEVICES UTILIZING NONOHMIC CURRENT PATHS ACROSS P-N JUNCTIONS

FIELD OF THE INVENTION

This invention relates to semiconductor devices, and more particularly relates to semiconductor devices having a nonohmic current path formed across a P-N junction.

THE PRIOR ART

Semiconductor switches are widely used in a variety of electronic control applications. Such semiconductor switches include four P-N-P-N three terminal devices of the type commonly termed silicon controlled rectifiers (SCRs). Operation and construction of such devices is commonly known and is described in chapter one of the *General Electric Silicon Controlled Rectifier Manual*, Second Edition, Copyright 1961 by The General Electric Company and in many issued patents.

The SCR is essentially a uni-directional control element. In order to exercise full wave power control, three lead five layer bilateral switches commonly termed a triac have been developed. Such triac devices are disclosed in various publications and U.S. patents, including U.S. Pat. No. 3,275,909 issued to Frank W. Gutzwiller. Further, bilateral switching devices having more than five layers have been developed in order to provide improved commutation and operating characteristics. Examples of such devices including six layers or more are disclosed and claimed in co-pending patent application Ser. No. 724,916 filed Sept. 20, 1976 by Applicant, a continuation of patent application Ser. No. 488,789, filed July 15, 1974, now abandoned.

While such previously developed semiconductor switches have worked well in practice, problems have occurred in preventing random triggering at wide temperature ranges, inasmuch as the maximum gate voltage for "off" periods varies with temperature. In conventional SCRs, switching generally begins at low currents and thus a moderate temperature increase may lead to a substantial decrease in the breakover voltage $V_{BO}$. Moreover, due to the low currents at which SCRs turn on, fast pulses and the associated charging currents may turn the device on before the pulses have attained the magnitude corresponding to the rated breakover voltage. To extend the range of maximum gate ratings of such devices and to reduce the spread in gate turn-on characteristics for a more reliable and precise triggering performance over wide temperature ranges, "shorted emitter" techniques have been heretofore developed. Such "shorted emitter" techniques comprise the use of an ohmic resistance path between layers of the devices.

For example, in an SCR, a shorted emitter ohmic resistance path is often made between the gate layer and the cathode contact of the SCR. When gate current is first initiated in the SCR, the majority of the current bypasses the gate-cathode junction and flows from the gate layer through the resistance ohmic element to the cathode contact. When the threshold voltage of the gate-cathode junction is exceeded, the SCR is turned on. The resistance ohmic path shunts some reverse current from the cathode-gate junction and therefore allows greater flexibility in the reverse direction. A description of such a "shorted emitter" construction is found in the Aldrich et al U.S. Pat. No. 3,476,993 issued Nov. 4, 1969.

Such "shorted emitter" techniques have however not been completely satisfactory, due to the phenomena of lateral current flow during turn-on of the device. Such lateral flow is described in detail in the previously described Gutzwiller and Aldrich patents. Such lateral current flow tends to increase the turn-on time of a switching device by slowing down the turn-on current flow during turn-on. In addition, previously developed "shorted emitter" configurations have been required to be deposited remote from the device gate, thereby tending to limit the conducting area of the device during opeation, as part of the cathode area of the device is blocked from contributing to turn-on conduction. A need has thus arisen for a technique which will provide operating stability over a wide range of temperatures and which will tend to prevent random triggering, and yet which will have a relatively fast turn-on time by eliminating substantial lateral current flow during turn-on. Moreover, such an improved device should not be limited as to its location on the switching device, so as to enable expansion of the conducting area of the device to provide expanded turn-on operating characteristics.

SUMMARY OF THE INVENTION

The present invention provides a technique for extending the range of maximum gate ratings and providing more reliable and precise triggering performance of semiconductor devices, without the disadvantages heretofore associated with prior art devices.

In accordance with the present invention, a semiconductor device includes a semiconductor body having layers of opposite conductivity type to form at least one P-N junction which intersects a face of the body. A selected material provides a nonohmic current path across the P-N junction, all of the conductance characteristics of the selected material being positive. Electrodes contact the body to form an electronic semiconductor device having improved operating characteristics over a wide temperature range.

In accordance with another aspect of the invention, a semiconductor device includes a body of semiconductor material having at least three alternating layers of opposite conductivity type forming a plurality of P-N junctions, at least one of the P-N junctions intersecting a face of the body. Material having positive conductance characteristics provides a nonohmic current path across the P-N junction intersecting the face. The first and second electrodes are connected to opposit faces of the body.

In accordance with yet another aspect of the invention, a semiconductor switching device includes a semiconductor body having at least four alternating layers of opposite conductivity types to form at least three P-N junctions. At least one of the interior layers of the body extends to an exterior surface of the body. First and second electrodes are connected to exterior surfaces of the body. A third electrode is connected to one interior layer. Material having all positive conductance characteristics provides a nonohmic current path between the one interior layer and one of the exterior layers of the body.

In accordance with yet another aspect of the invention, a semiconductor switching device includes a body of semiconductor material having at least four layers of alternating opposite conductivity type to form at least three P-N junctions. One of the interior layers extends through a portion of one of the exterior layers to the exterior surface of the body. Cathode and anode electrodes contact opposite exterior surfaces of the body. A gate electrode contacts the one interior layer extending to the exterior surface of the body. Material bridges the P-N junction between the one interior layer and the exterior layer for forming a Schottky diode to provide a nonohmic current path across said P-N junction.

In accordance with a more specific aspect of the invention, a semiconductor switch includes a body of semiconductor material including at least five layers of alternating opposite conductivity types to form at least four P-N junctions. A first anode electrode is formed on a first face of the body and contacts two adjacent layers. A second anode electrode is formed on a second face of the body and contacts two different adjacent layers. A gate electrode contacts the first face of the body. One of the P-N junctions is disposed between the first anode electrode and the gate electrode. Material provides a nonohmic current path across the P-N junction.

In accordance with yet a more specific aspect of the invention, a semiconductor switch device having symmetrical bidirectional switching characteristics includes a body of semiconductor material having five layers of alternating first and second opposite conductivity types to form a plurality of P-N junctions, the body having two outer layers of the first conductivity type. A pair of heavily doped discrete regions of the second conductivity type are formed in one of the outer layers and are spaced apart on the exterior surface of the outer layer. A first groove extends through one of the outer layers and is disposed between the regions of the second conductivity type in order to electrically isolate the regions from one another. First and second electrodes contact the heavily doped regions. Third and fourth electrodes contact the one outer layer on opposite sides of the first groove. A heavily doped discrete region of the second conductivity type is formed on the other of the outer layers. A second groove extends through the other outer layer and is disposed between the heavily doped region and the exterior surface of the other outer layer. A fifth electrode contacts the heavily doped region in the other outer layer and a sixth electrode contacts the exterior surface of the other outer layer on the opposite side of the second groove from said heavily doped region. A layer of material provides a nonohmic current path across interior P-N junctions formed by ones of the five layers in order to provide improved operating characteristics of the device.

DESCRIPTION OF THE DRAWINGS

For a more complete understanding of the present invention and for other objects and advantages thereof, reference is now made to the following description taken in conjunction with the accompanying drawings, in which.

DESCRIPTION OF THE PREFERRED EMBODIMENT

Figure 1:
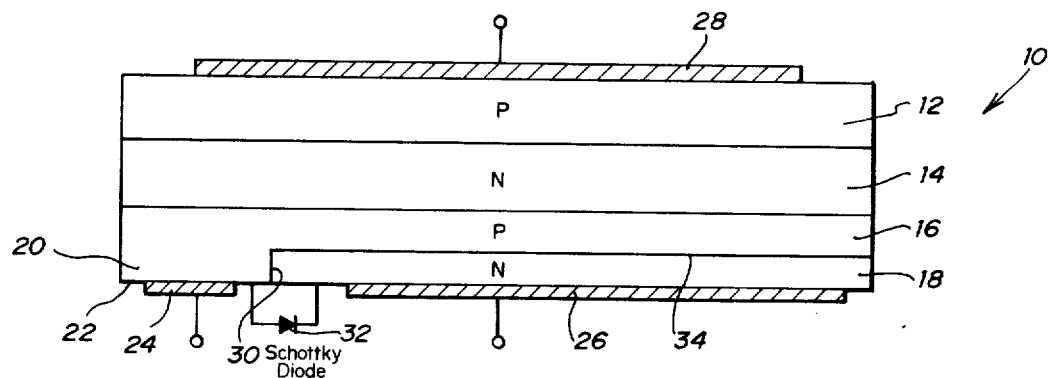
FIG. 1 is a somewhat diagrammatic illustration of a three terminal unidirectional control device embodying the nonohmic current path of the present invention.

Referring to FIG. 1, a semiconductor body 10 includes four alternating layers of opposite conductivity types to form a P-N-P-N device. Body 10 includes a P-layer 12, N-type layer 14, P-type layer 16 and an N-type layer 18. P-type layer 16 includes a portion 20 which extends through the N-type layer 18 and communicates with the exterior surface 22 of the body 10. A gate electrode 24 is formed in low ohmic resistance with portion 20 of the P-type layer 16. A cathode electrode 26 is formed in low ohmic resistance contact with N-type layer 18. An anode electrode 28 is formed in low ohmic resistance contact with the P-type layer 12. A P-N junction 30 thus intersects a face of body 10. For the purposes of this invention, the term "face" is defined to mean an exterior surface of the body 10, including an exterior surface formed by a groove or by other suitable techniques. The device as thus illustrated comprises a three terminal unidirectional switching device.

In accordance with the present invention, a nonohmic current path is provided across the P-N junction 30 which is formed by layers 16 and 18. The nonohmic current path in the preferred embodiment is provided by a Schottky diode 32. The anode of diode 32 is connected in contact with the p-type layer 16, while the cathode of diode 32 is connected in contact with N-type layer 18, such that the diode is connected in parallel with the P-N junction. It will be understood that other types of nonohmic devices may be utilized in conjunction with the present invention. However, such nonohmic current paths must have all positive conductance characteristics such that the input admittance is always positive, in order to eliminate oscillation of the device during operation thereof. An ohmic or "shorting" current path placed across the P-N junction 30 would render the device of FIG. 1 inoperative, as a short would exist between the gate and cathode junction. However, the nonohmic, and therefore nonlinear, Schottky diode 32 enables operation of the switching device shown in FIG. 1 while providing improved operation stability during wide temperature ranges.

In addition, the use of the Schottky diode 32 across the P-N junction between the gate 24 and cathode 26 eliminates substantial lateral current during turn-on of the device, and therefore increases the turn-on speed of the device. Moreover, the location of the Schottky diode 32 in the illustrated position substantially increases the area of the switching device which is rendered conductive, thereby substantially improving the turn-on characteristics of the device over conventional "shorted emitter" configurations, which require lateral currents and which limit the area of conduction of the switching device due to blocking of part of the cathode area from contribution to turn-on conduction.

It is important that the material forming the nonohmic current path across the P-N junction 30 has a reverse breakdown higher than the forward conduction characteristics of the P-N junction 30, and conversely that the material has a forward voltage drop lower than the effective emitter formed by the P-N junction. In this way, during operation of the present device, the Shottky diode 32 provides a current path for leakage current without crossing the P-N junction 34 which would increase the beta of the device and cause switching instability.

Figure 2:
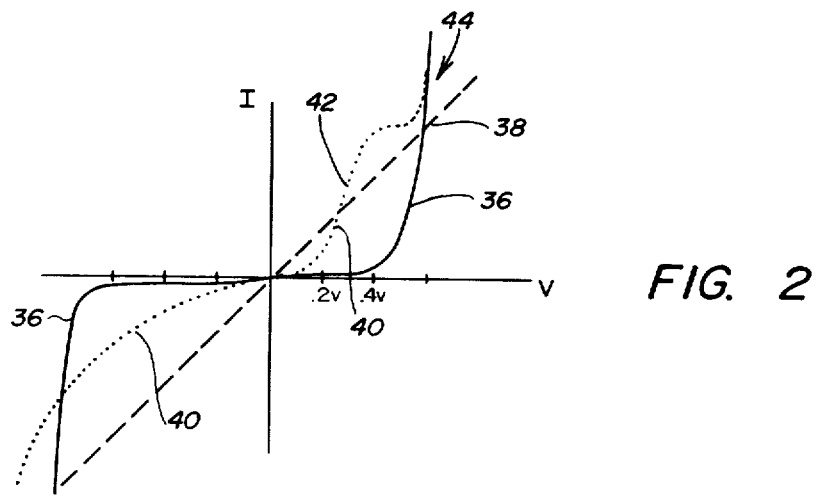
FIG. 2 is a waveform illustrating the general operation of the device shown in FIG. 1.

FIG. 2 is a graph of the V-I characteristics of various junction configurations. The solid line 36 is a representative of the V-I characteristics of a conventional P-N junction, and may be seen to comprise the well-known P-N diode characteristics. The dotted line 38 comprises the V-I characteristics of a linear ohmic short across a P-N junction. The dotted line 40 is representative of the V-I characteristics of the Schottky diode 32 connected in parallel with the P-N junction 30 as shown in FIG. 1. The Schottky diode characteristic does not materially rise until the application of predetermined voltage, which may be for example in the range of 0.2 volts. The Schottky diode configuration however then "lifts" higher than the conventional P-N junction or the shorted junction at region 42. The Schottky diode curve then tends to "merge" with the P-N curve at the region 44.

Figure 3:
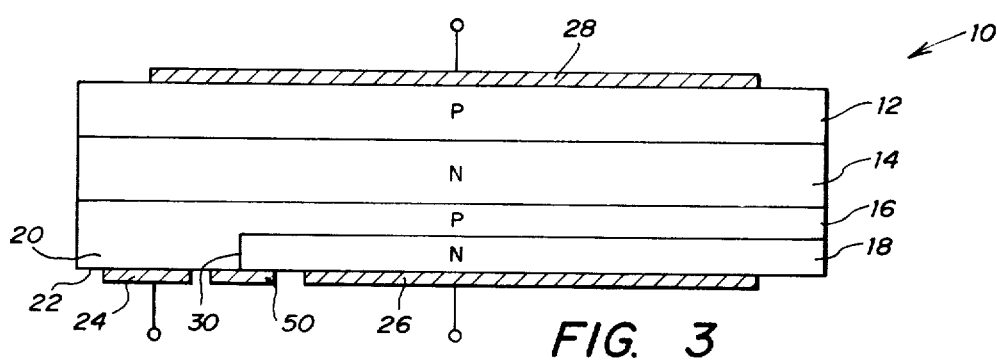
FIG. 3 is a sectional view of a device formed in accordance with the preferred embodiment of the present invention which embodies the invention shown in FIG. 1.

FIG. 3 illustrates a preferred embodiment of the invention which provides improved operating characteristics to a three terminal unidirectional SCR. The construction of the semiconductor body 10 is identical to that described in FIG. 1, and like numerals are utilized for like and corresponding parts in the two Figures.

In this embodiment, a Schottky diode is fabricated by the application of a layer 50 which bridges or sits astride the P-N junction 30 which interferes with the surface 22 of body 10. Layer 50 may be comprised of any material having suitable doping characteristics to provide a Schottky diode barrier with the P-type layer 16. A layer of chromium has been found to provide an effective Schottky diode in parallel with the P-N junction 30 and to provide substantially improved operating characteristics to the device. It will however be understood that other layers of material such as molybdenum, copper, or even semiconductor material may be utilized if the doping levels and other characteristics are chosen to provide the desired nonohmic operating characteristics.

The device shown in FIG. 3, and the subsequent devices to be described, may be formed in any one of a number of suitable techniques well-known in the art. For example, an N-type electrical conductivity silicon wafer may be diffused on both sides to form the layers 12, 14 and 16. The N layer 18 may then be formed in layer 16 by conventional diffusion techniques using suitable dopants or impurities which are compatible with the particular semiconductor material being operated upon. The particular size and shapes of the diffused regions are of course determined by suitable masking and photographic techniques conventionally employed in semiconductor diffusion technology. It will be understood that any suitable semiconductor material may be utilized to form devices according to the invention, but for clarity of illustration, reference is made in the drawings to particular conductivity types and to silicon as to the material being utilized. Of course, the electrical conductivity types herein specified may be interchanged and reversed. The various doping levels of the present invention are well-known in the art and will not thus be described specifically.

The chromium layer 50 may be applied by several suitable techniques, such as sputtering of a chrome target in an argon atmosphere. The other electrodes are applied by conventional techniques such as evaporation or the like.

An important aspect of the device shown in FIG. 3 is that the Schottky diode formed by layer 50 provides a nonohmic current path around the P-N junction 30 which is disposed between the gate 24 and the cathode 26. Hence, substantial lateral currents are not generated within the device during the initial switching operations, thereby tending to improve the turn-on time and other characteristics of the device. Moreover, the illustrated positioning of the Schottky diode causes the very large surface area of the device to conduct during turn-on. This provides excellent turn-on characteristics, unlike previously developed SCRs having shorted emitters which are required to be disposed remote from the gate. Such shorted emitters cause very localized turn-on and therefore wasted relatively large areas of the device which are not utilized during the complete turn-on phenomena. The nonlinear and positive conductance characteristics of the Schottky diode enable it to be placed over the P-N junction between the gate and cathode as illustrated, whereas it would not be possible to produce an operable device using an ohmic short at that location.

Figure 4:
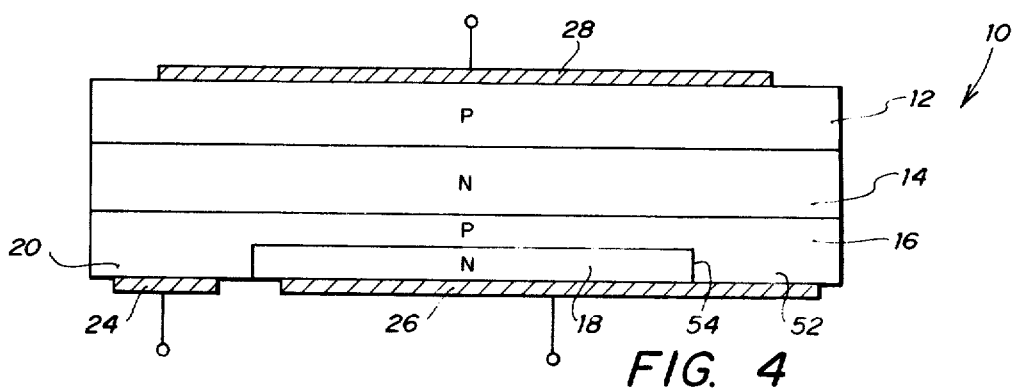
FIG. 4 is a sectional view of an alternate embodiment of a four layer switching device embodying the present invention.

FIG. 4 illustrates another embodiment of the invention, wherein like numbers are utilized for like and corresponding parts. In this embodiment, the semiconductor body 10 is constructed as shown in FIG. 3, with the exception that a portion 52 of the P-type layer 16 extends to the exterior surface of the body. The N-type layer 18 is thus completely surrounded at its periphery by the P-type layer 16. The cathode electrode 26 in this embodiment is fabricated from chromium or the like and extends across the P-N junction 54 formed between the layers 16 and 18. In this manner, the electrode 26 acts both as a cathode electrode and as a Schottky diode connected in parallel with the P-N junction 54. The Schottky diode in this embodiment is not disposed between the gate 24 and the cathode 26.

Figure 5:
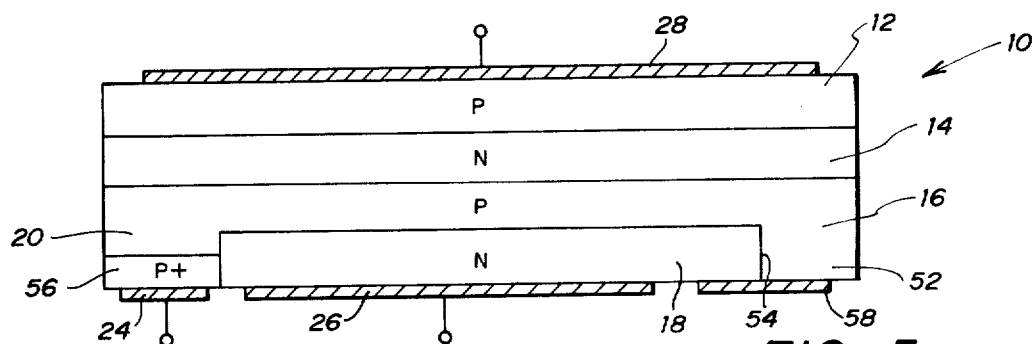
FIG. 5 is an alternate embodiment of a five layer three terminal switching device embodying the present invention.

FIG. 5 illustrates a variation of the configuration shown in FIG. 4, wherein like numerals are utilized for like and corresponding parts. In this embodiment, the gate electrode 24 contacts a P+ region 56 formed in contact with the P-type layer 16. The cathode electrode 26 in this embodiment does not bridge the P-N junction 54. However, a layer 58 of chromium or other suitable material bridges the P-N junction 54 to form a Schottky diode in parallel with the junction 54. In this embodiment, electrode 26 and chromium layer 58 do not contact one another. This embodiment is advantageous in that the chromium layer 58 is not degraded by continuous application of voltages to the cathode electrode 26.

Figure 6:
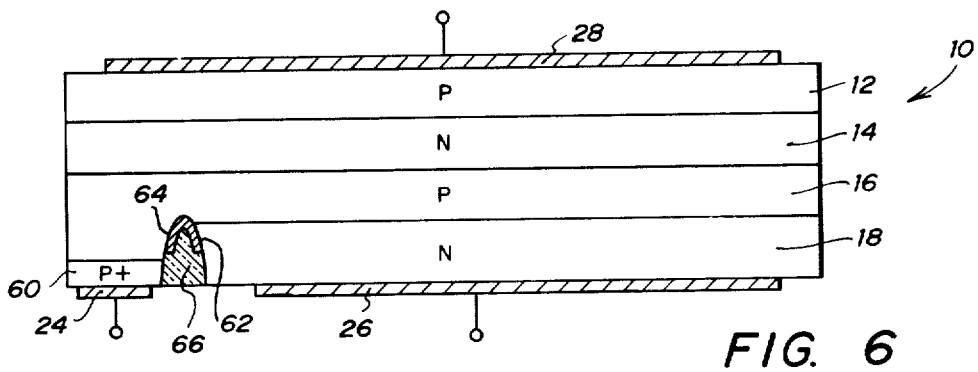
FIG. 6 is a cross sectional view of another embodiment of the present invention.

FIG. 6 illustrates another embodiment of the invention which is a variation of the structure shown in FIG. 3, and wherein like numerals are utilized for like and corresponding parts. In this embodiment, a P+ region 60 is provided to contact the gate electrode 24, while the cathode electrode 26 contacts the N-type layer 18. A Schottky diode is formed by depositing a layer of chromium 62 within a groove 64 formed between the gate and cathode electrodes. A P-N junction between layers 16 and 18 thus intersects groove 64, which defines a face or exterior surface of body 10. The chromium layer 62 does not contact the P+ region 60 but crosses or bridges the P-N junction formed between the layers 16 and 18. A layer of passivating glass 66 is formed within the groove 64 to protect the chromium layer 62. This device acts in the same manner as the device shown in FIG. 3 to provide the aforedescribed advantages of operation.

Figure 7:
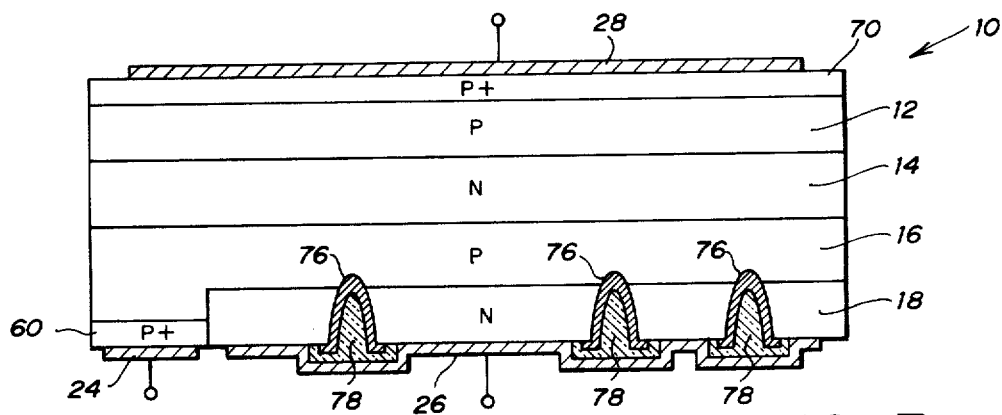
FIG. 7 is a cross sectional view of yet another embodiment of the present invention.

FIG. 7 illustrates a variation of the structure shown in FIG. 6 wherein a plurality of Schottky diodes are formed on a device. In this embodiment, a P+ region 70 is formed adjacent the P-type layer 12 and contacts the anode electrode 28. A P+ region 60 is formed adjacent the P-type layer 16 and contacts the gate electrode 24 in the manner shown in FIG. 6. In this embodiment, three grooves are formed through the N-type layer 18 and into the P-type layer 16 and chromium layers 76 are formed within the grooves to bridge the P-N junction between the layers 16 and 18. Passivating glass 78 fills the grooves and protects the chromium layers. The cathode electrode 26 is formed over the passivating material 78 in the manner illustrated.

Figure 8:
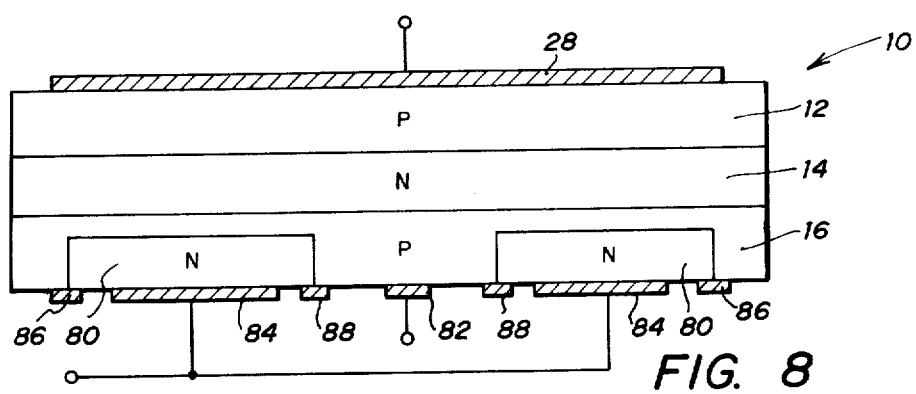
FIG. 8 is a cross sectional view of an embodiment of the invention having circular geometry.
Figure 9:
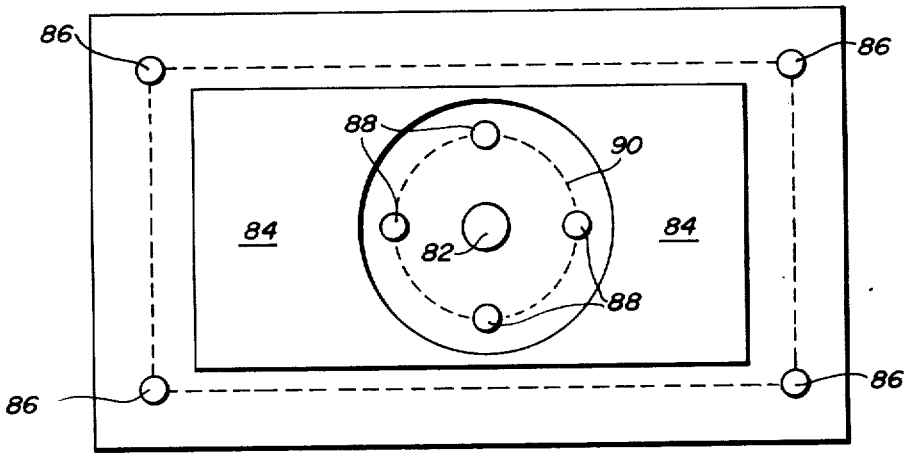
FIG. 9 is a top view of the embodiment shown in FIG. 8.

FIGS. 8 and 9 illustrate an improved SCR according to the invention and having a circular geometry. Referring to FIG. 8, the cross-sectional configuration of the body includes an anode electrode 28 contacting a P-type layer 12 which in turn contacts an N-type layer 14 and a P-type layer 16. An annular N-type layer 80 is formed in the exterior surface of the P-type layer 16. A gate electrode 82 contacts the P-type layer 16. A continuous cathode electrode 84 contacts the generally annular N-type layer 80. In accordance with the invention, chromium layers 86 are formed at the outer P-N junctions formed by the P-type layer 16 and the N-type layer 80. Similarly, chromium layers 88 are formed at the inner P-N junctions formed between layers 16 and 80.

FIG. 9 is a bottom view of the device shown in FIG. 8, and illustrates the cathode electrode 84 which has a rectangular outer periphery and includes a circular aperture formed in the center thereof. The gate electrode 82 is formed in the center and contacts the P-type layer 16 previously noted. Four Schottky diodes are formed by the chromium layers 86 which are spaced at the four corners of the P-N junction formed between the P-type layer 16 and the N-type region 80. Four Schottky diodes are also formed by the chromium regions 88 which are formed equaldistantly around the circular P-N junction formed between the P-type layer 16 and the N-type region 80 as illustrated by the dotted line 90.

Figure 10:
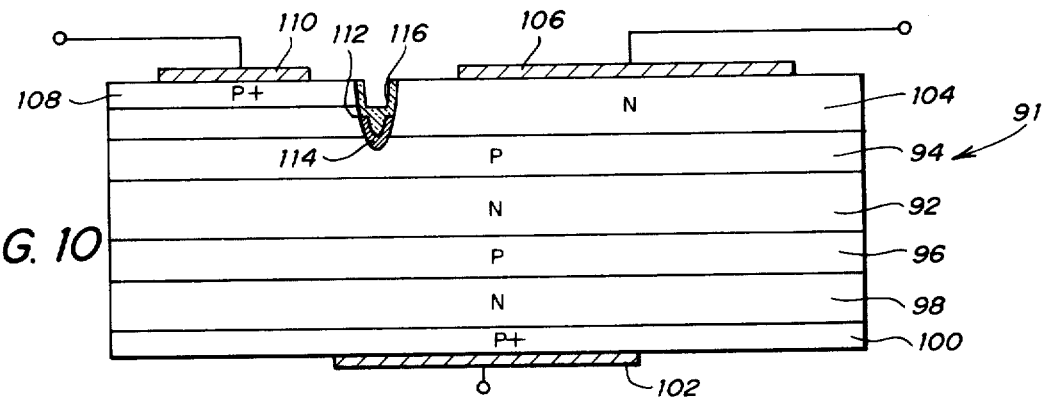
FIG. 10 is a sectional view of a seven layer unidirectional switching device embodying the present invention.

FIG. 10 is a cross-sectional view of a three electrode unidirectional switch having seven alternating layers of opposite conductivity type. Such seven layer switching devices have been previously described in the copending patent application Serial Number 724,916 by Applicant and entitled "Multilayer Semiconductor Switching Devices", filed September 20, 1976, a continuation of application Ser. No. 488,789, filed July 15, 1974, now abandoned. As described, such seven layer devices have more interior P-N junctions than do conventional four layer SCRs, and therefore are provided with improved operating characteristics. In the embodiment shown in FIG. 10, a body of semiconductor material 91 includes a center N-type layer 92 surrounded on opposite sides by P-type layers 94 and 96. An N-type region 98 is formed adjacent layer 96 and is connected to a P+ layer 100. An electrode 102 is formed to act as an anode electrode. An N-type layer 104 is formed adjacent layer 94 and is connected to a cathode electrode 106. A P+ layer 108 is formed adjacent a portion of the layer 104 and is connected to a gate electrode 110.

A groove 112 is formed between the P+ layer 108 and the N-type layer 104 and extends into the P-type layer 94. A layer 114 of chromium or the like is deposited in the groove 112 and bridges the P-N junction formed between layers 94 and 104. Glass 116 protects the chromium layer 114. This embodiment improves the operating characteristics of the illustrated seven layer device over a wide range of temperatures in the manner of operation generally similar to that previously described.

Figure 11:
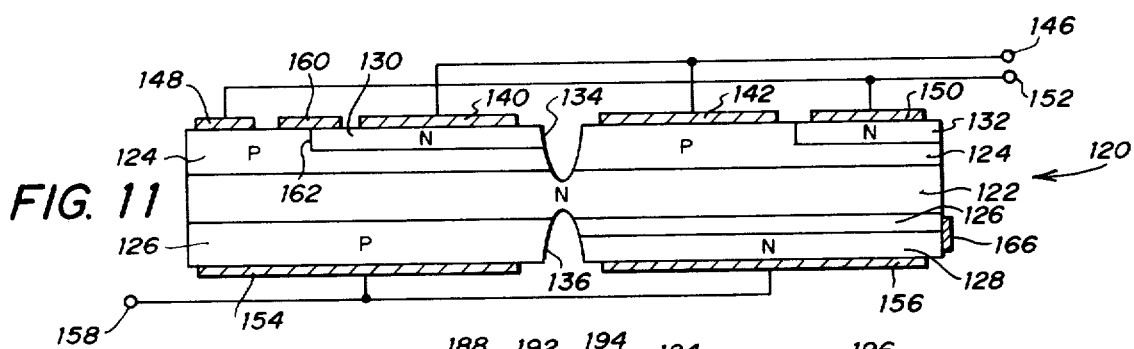
FIG. 11 is a sectional view of a five layer bidirectional switching device embodying the present invention.

FIG. 11 is a cross-sectional view of the present invention utilized on a five layer bidirectional symmetrical switching device of the type generally termed a triac. In this embodiment, a semiconductor body 120 includes a center layer 122 of N-type material surrounded on opposite sides by P-type layers 124 and 126. N-type layer 128 is formed adjacent one side of the P-type layer 126. A first N-type region 130 is formed in the exterior of the P-type layer 124 and a second N-type region 132 is spaced apart from the N-type region 130. A groove 134 extends through P-type layer 124 into the N-type layer 122 and geometrically and electrically isolates N-type region 130 from the N-type region 132. A groove 136 extends through the P-type layer 126 into the N-type layer 122 and geometrically and electrically isolates one-half of the P-type layer 126 from the N-type layer 128.

An electrode 140 contacts N-type region 130, while an electrode 142 contacts the P-type layer 124. Electrodes 140 and 142 are interconnected to form a first electrode 146. An electrode 148 contacts one-half of the P-type layer 124, while an electrode 150 contacts the N-type region 132. Electrodes 148 and 150 are interconnected to form a second electrode 152. An electrode 154 contacts the P-type layer 126, while an electrode 156 contacts the N-type layer 128. Electrodes 154 and 156 are interconnected to form a third electrode 158.

In accordance with the present invention, a layer of chromium 160 is formed across the P-N junction 162 formed between the N-type region 130 and the P-type layer 124. In addition, a layer 166 of chromium bridges or sits astride the P-N junction formed between the P-type layer 126 and the N-type layer 128. It will be understood that layers 160 and 166 may be positioned at different locations. Chromium layers 160 and 166 operate as Schottky diodes connected in parallel with the P-N junctions in order to afford improved operating characteristics over a wide range of temperatures by providing a path for leakage current to inhibit switching instability of the device.

Figure 12:
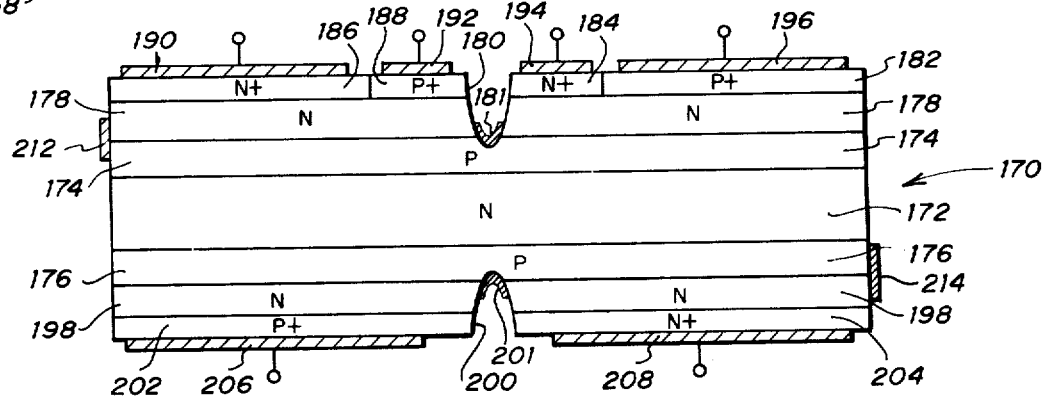
FIG. 12 is a seven layer bidirectional switching device embodying the present invention.

FIG. 12 illustrates a seven layer bidirectional symmetrical switching device of the type disclosed in previously described patent application Ser. No. 724,916 filed on Sept. 20, 1976, a continuation of application Ser. No. 488,789, filed on July 15, 1974, now abandoned by Applicant. In this device, seven layers of opposite conductivity types are interconnected to function similar to two discrete silicon controlled rectifiers to provide a triac function. However, unlike conventional triacs, the present invention may be commutated at high rates and provides improved operating characteristics.

In this embodiment, the switching device includes a semiconductor body 170 which includes an N-type layer 172 surrounded on opposite sides by P-type layers 174 and 176. An N-type layer 178 is formed adjacent layer 174 and is geometrically and electrically isolated by means of a groove 180. A metal layer 181 of chromium or the like is formed in the groove in the preferred embodiment to form a Schottky diode across the two P-N junctions which intersect the walls of the groove. On one side of the groove, a P+ layer 182 is disposed adjacent an N+ layer 184. On the other side of the groove 180, an N+ layer 186 is formed adjacent a P+ layer 188. An electrode 190 contacts the layer 186, while an electrode 192 contacts the layer 188. An electrode 194 contacts the layer 184, while an electrode 196 contacts layer 182.

An N-type layer 198 is formed adjacent layer 176 and is divided by a groove 200 extending thereacross. A layer 201 of chromium or other suitable metal is deposited in groove 200 to form a Schottky diode which bridges the P-N junction between layers 176 and 198. A P+ layer 202 is disposed adjacent one-half of the layer 198 while an N+ layer 204 is disposed adjacent the other half of the layer 198. An electrode 206 contacts layer 202, while an electrode 208 contacts layer 204. The device shown in FIG. 12 may have electrodes 192 and 194 interconnected, and electrodes 190 and 196 interconnected, along with electrodes 206 and 208, to form a three terminal switching device having symmetrical switching characteristics.

Although Schottky layers 181 and 201 are preferred in accordance with the present invention, a chromium layer 212 may also be deposited on the edge of the body 170 across the P-N junction between layers 174 and 178. Similarly, a chromium layer 214 may be deposited on the edge of the body 170 across the P-N junction formed between layers 176 and 198. Chromium layers 212 and 214 thus form Schottky diodes in parallel with the bridge to P-N junctions to provide the operating characteristics previously noted. If desired, in some instances, Schottky diodes may also be formed across the P-N junctions between layers 174 and 178 and 176 and 198 on the opposite sides of the grooves 180 and 200. Instead of the grooves 180 and 200, it will be understood that other isolating devices may be utilized.

Schottky diodes 181 and 201 may be used with or without Schottky diodes 212 and 214.

The positioning of diodes 181 and 201 near the gate of the device provides numerous operating advantages. In prior "shorted emitter" triac configurations, the short was required to be positioned remote from the gate electrode. In such devices, when the current is lowered to approach the holding current, the last area of the device to conduct is generally the area most remote from the short and therefore nearest to the gate. This reduces the commutation characteristics of the prior devices.

However, with the device shown in FIG. 12, the Schottky diodes 181 and 201 may be formed closely adjacent the device gate. Thus, the last area of the device to conduct as the holding current is approached is near the outer edge of the device, thereby substantially improving the commutation characteristics of the present device.

As shown in FIG. 2, the use of the Schottky diode provides a voltage drop at very low currents. This voltage across the P-N junctions of the device shown in FIG. 12 assists in the collection of holes, thereby increasing the sensitivity of the gate of the device. Due to the resulting increase of collector efficiency provided by the present device, the improvement in the gate sensitivity enables the device to operate at lower gate signals. The turn-on characteristics of the present device are thus excellent.

In the illustrated embodiments, chromium layers have been described as making Schottky connections to P type layers. It will be understood that other materials could be used to alternatively provide a Schottky barrier to N type material.

Thus, it may be seen that the present invention provides a technique for extending the range of maximum gate ratings of switching devices and to provide more reliable and precise triggering performance over wide temperature ranges. The present invention provides a nonohmic current path across a P-N junction having positive conductance characteristics, such that the input admittance of the device is always positive to prevent oscillation during operation of the switching device. Due to the nonohmic current path provided by the present invention, which in the preferred embodiment is a Schottky diode, the present device may be positioned between the gate and cathode of an SCR in order to eliminate substantial lateral current during turn-on to increase the turn-on speed of the SCR. Moreover, the present device may be so positioned to increase the area of conduction of the SCR to improve the operating characteristics thereof, as no portion of the cathode area of the device is required to be blocked from contributing to turn-on conduction.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:
1. A semiconductor device comprising:
a semiconductor body having layers of opposite conductivity type to form at least one P-N emitter junction which intersects a face of said body,
means for providing a nonohmic current path across said P-N junction, all conductance and input admittance characteristics of said means being positive, said means having a reverse breakdown higher than the forward conduction characteristic of said P-N junction and having a forward voltage drop lower than the effective emitter formed by said P-N junction, and
electrodes contacting said body to form an electrical semiconductor device.

2. The device of claim 1 wherein said means comprises a Schottky diode.

3. The device of claim 1 wherein said means comprises a discrete metal layer forming a Schottky diode with an adjacent semiconductor layer.

4. A semiconductor switching device comprising:
a semiconductor body having at least four alternating layers of opposite conductivity types to form at least three P-N junctions,
at least one of the interior layers of said body extending to an exterior surface of said body, cathode and anode regions connected to opposite exterior surfaces of said body, a gate region connected to said one interior layer and formed on the same exterior surface as said cathode region with a P-N junction intersecting said exterior surface between said cathode and gate regions, and a Schottky diode having all positive conductance characteristics and formed across said P-N junction with the anode of said diode connected to said gate region and the cathode of said diode connected to said cathode region for providing a nonohmic current path between said one interior layer and one of the exterior layers of said body.

5. The switching device of claim 4 wherein said cathode region extends over said P-N junction to form said Schottky diode.

6. A semiconductor switching device comprising:

a body of semiconductor material having at least four layers of alternating opposite conductivity type to form at least three P-N junctions, one of the interior layers extending through a portion of one of the exterior layers to the exterior surface of said body, cathode and anode regions formed on opposite exterior surfaces of said body, a gate region formed on said one interior layer extending to the exterior surface of said body and formed on the same exterior surface as said cathode region, and material bridging the P-N junction between said one interior layer and said exterior layer for forming a Schottky diode having an anode contacting said gate region and a cathode contacting said cathode region to provide a nonohmic current path across said P-N junction.

7. The switching device of claim 6 wherein said material comprises a layer of chrome over said P-N junction.

8. The switching device of claim 6 wherein said Schottky diode has a reverse breakdown characteristic lower than the forward conduction characteristic of said P-N junction.

9. The switching device of claim 6 wherein said Schottky diode has a forward voltage drop lower than the effective emitter gate formed by said P-N junction.

10. The switching device of claim 6 wherein said material comprises chromium.

11. The switching device of claim 6 wherein said material is deposited in a groove formed in the exterior surface of said body.

12. The switching device of claim 6 wherein said cathode region extends over said P-N junction to form said Schottky diode.

13. A semiconductor switch comprising:

a body of semiconductor material including at least five layers of alternating opposite conductivity types to form at least four P-N junctions, a first anode electrode formed on a first face of said body contacting two adjacent layers, a second anode electrode formed on a second face of said body and contacting two different adjacent layers, a gate electrode contacting said first face of said body, one of said P-N junctions disposed between said first anode electrode and said gate electrode, and means for providing a nonohmic current path across said P-N junction, said means having a reverse breakdown higher than the forward conduction characteristic of said P-N junction and further having a forward voltage drop lower than the effective emitter formed by said P-N junction.

14. The device of claim 13 wherein said means comprises a Schottky diode.

15. A semiconductor switch device having symmetrical bidirectional switching characteristics comprising:

a body of semiconductor material including five layers of alternating first and second opposite conductivity types to form a plurality of P-N junctions, said body having two outer layers of said first conductivity type, a pair of discrete regions of said second conductivity type being formed in one of said outer layers and spaced apart on the exterior surface of said outer layer, first isolation means extending through said one of said outer layers and disposed between said regions of said first and second conductivity type in order to electrically isolate said regions from one another, first and second electrodes contacting said pair of regions, third and fourth electrodes contacting said one outer layer on opposite sides of said first isolation means, a discrete region of said second conductivity type formed in the other of said outer layers, second isolation means extending through said other of said outer layers and disposed between said region and the exterior surface of said other outer layer, a fifth electrode contacting said region in said other outer layer, a sixth electrode contacting the exterior surface of said other outer layer on the opposite side of said second isolation means from said region, and means for providing a nonohmic current path across interior P-N junctions formed by ones of said five layers.

16. The semiconductor switch device of claim 15 wherein said first and fourth electrodes are connected to form a gate electrode, said second and third electrodes are connected to form a first anode and said fifth and sixth electrodes are connected to form a second anode.

17. The semiconductor switch device of claim 15 wherein said means comprises a Schottky diode.

18. The semiconductor switch device of claim 17 wherein said Schottky diode is formed in the region of said isolation means to improve the operating characteristics of the device.

19. The semiconductor switch device of claim 17 wherein said Schottky diode is formed remote from said isolation means.

* * * * *